(12) United States Patent
Shih

(10) Patent No.: US 10,211,061 B1
(45) Date of Patent: Feb. 19, 2019

(54) METHOD FOR MANUFACTURING A SEMICONDUCTOR STRUCTURE

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/826,713

(22) Filed: Nov. 30, 2017

(51) Int. Cl.
*H01L 21/308* (2006.01)
*H01L 21/32* (2006.01)

(52) U.S. Cl.
CPC .......... *H01L 21/3086* (2013.01); *H01L 21/32* (2013.01)

(58) Field of Classification Search
CPC ............................. H01L 21/3086; H01L 21/32
See application file for complete search history.

(56) References Cited

U.S. PATENT DOCUMENTS

2007/0082296 A1* 4/2007 Yang .................... G03F 7/0035
430/311

* cited by examiner

*Primary Examiner* — Karen Kusumakar
(74) *Attorney, Agent, or Firm* — CKC & Partners Co., Ltd.

(57) ABSTRACT

A method for manufacturing a semiconductor structure includes forming a target layer, a lower hard mask layer, a middle hard mask layer, and an upper hard mask layer in sequence on a substrate. A first mask layer is then formed on the upper hard mask layer. A first patterned upper hard mask layer having at least one recess and at least one remained portion under the recess is formed, wherein the remained portion remains a thickness that is less than a depth of the recess. A patterned organic layer is then formed on the recess. A second patterned upper hard mask layer is form by etching the first patterned upper hard mask layer. A patterned target layer is then formed by etching the middle hard mask layer, the lower hard mask layer, and the target layer by using the second patterned upper hard mask layer as a mask.

14 Claims, 5 Drawing Sheets

METHOD FOR MANUFACTURING A SEMICONDUCTOR STRUCTURE

BACKGROUND

Field of Invention

The present invention relates to a method for manufacturing a semiconductor structure. More particularly, the present invention relates to a method for manufacturing fine patterns of semiconductor structure by using double patterning technology.

Description of Related Art

As semiconductor devices become smaller and highly integrated, a number of technologies for fabricating fine patterns for semiconductor devices have been developed. Particularly, the required pitch size and critical dimension (CD) are continuously shrinkage. However, photolithographic processes for fabricating semiconductor features have appeared a limitation in the resolution of the exposure apparatus.

In order to make semiconductor devices fine beyond the resolution limit of photolithographic processes, double patterning technologies such as lithography-etching-lithography-etching (LELE) processes or the like has been actively developed. However, the conventional LELE processes have the problem that features are easily damaged, and that leads to a low yield. In addition, etching nonuniformity may occur on the target layer. Accordingly, there is a demand for a method for solving the above problems.

SUMMARY

The present invention has been made in an effort to improve the conventional double patterning technology, providing a method for manufacturing a semiconductor structure with fine patterns.

In accordance with an aspect of the present invention, a method for manufacturing a semiconductor structure is provided. The method includes forming a target layer, a lower hard mask layer, a middle hard mask layer, and an upper hard mask layer in sequence on a substrate, forming a first mask layer on the upper hard mask layer, wherein the first mask layer has a plurality of openings exposing a portion of the upper hard mask layer, etching the exposed portion of the upper hard mask layer to form a first patterned upper hard mask layer comprising at least one recess and at least one remained portion under the recess, wherein the remained portion remains a thickness that is less than a depth of the recess, forming a patterned organic layer on the recess of the first patterned upper hard mask layer, etching the first patterned upper hard mask layer to form a second patterned upper hard mask layer having a plurality of apertures exposing a portion of the middle hard mask layer, and etching the middle hard mask layer, the lower hard mask layer, and the target layer by using the second patterned upper hard mask layer as a mask to form a patterned target layer.

According to one embodiment of the present invention, the first patterned upper hard mask layer has a plurality of first stripe structures, the patterned organic layer has a plurality of second stripe structures, the first stripe structures are parallel with the second stripe structures, and each of the second stripe structures is disposed between the first stripe structures.

According to another embodiment of the present invention, the upper hard mask layer has a thickness that is greater than a thickness of the middle hard mask layer.

According to another embodiment of the present invention, the upper hard mask layer and the middle hard mask layer are made of different material.

According to another embodiment of the present invention, the upper hard mask layer comprises silicon oxide.

According to another embodiment of the present invention, the middle hard mask layer comprises silicon nitride, silicon oxynitride or silicon carbide.

According to another embodiment of the present invention, the method of claim 1, wherein the middle hard mask layer and the lower hard mask layer are made of different material.

According to another embodiment of the present invention, the lower hard mask layer comprises amorphous carbon, polysilicon oxide.

According to another embodiment of the present invention, etching the exposed portion of the upper hard mask layer comprises using an anisotropic etching process.

According to another embodiment of the present invention, etching the first patterned upper hard mask layer comprises using an anisotropic etching process.

According to another embodiment of the present invention, etching the middle hard mask layer, the lower hard mask layer, and the target layer are performed by anisotropic etching process.

According to another embodiment of the present invention, forming the patterned organic layer on the recess of the first patterned upper hard mask layer is further including forming an organic layer covering the first patterned upper hard mask layer, forming a second mask layer on the organic layer, and etching the organic layer to form the patterned organic layer.

According to another embodiment of the present invention, the patterned organic layer has a plurality of gaps exposing a top surface of the first patterned upper hard mask layer.

According to another embodiment of the present invention, the patterned organic layer has a thickness that is greater than a thickness of the first patterned upper hard mask layer.

It is to be understood that both the foregoing general description and the following detailed description are by examples, and are intended to provide further explanation of the invention as claimed.

BRIEF DESCRIPTION OF THE DRAWINGS

Aspects of the instant disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
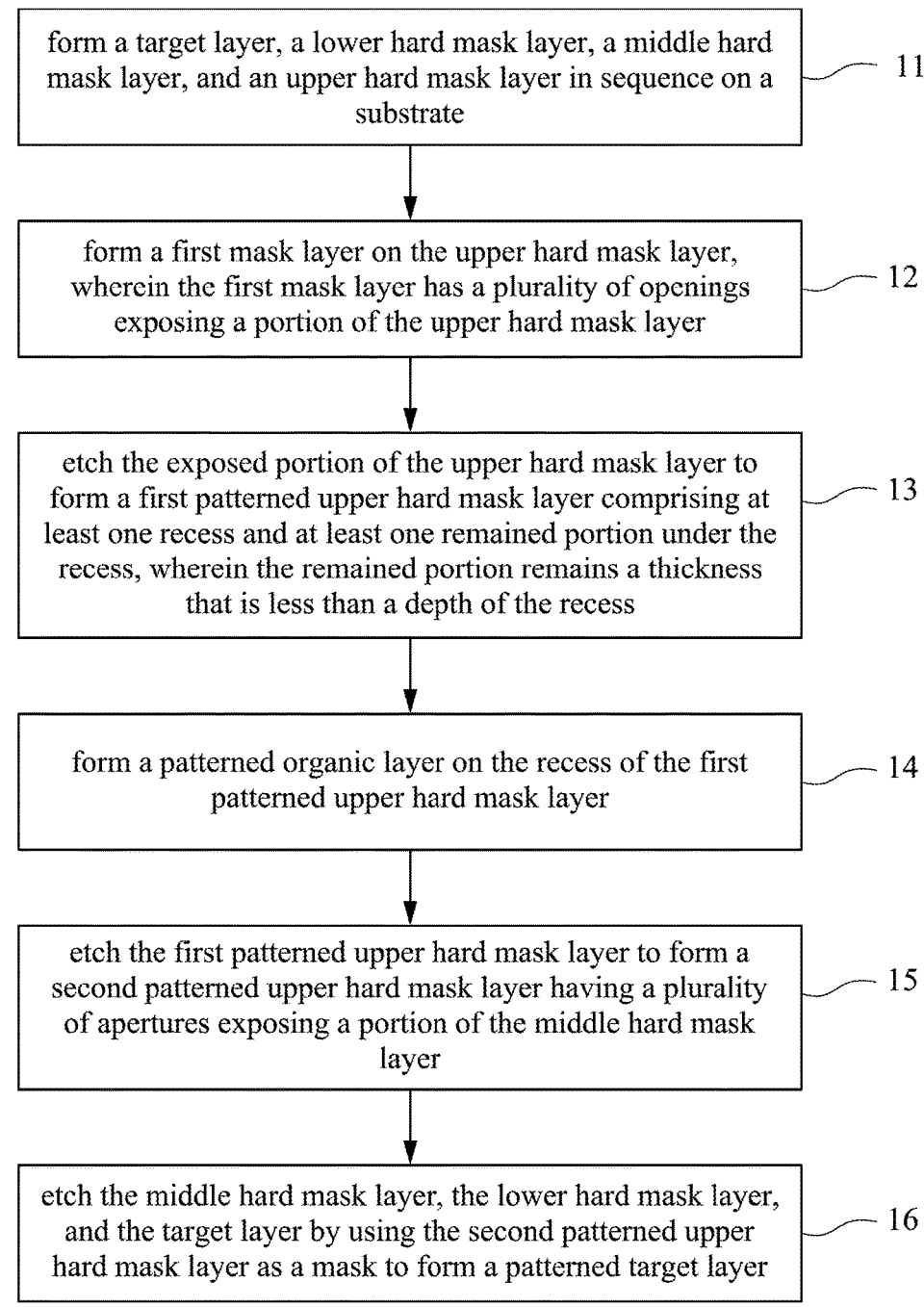
FIG. 1 is a flow chart illustrating a method of manufacturing a semiconductor structure in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" include plural referents unless the context clearly dictates otherwise. Therefore, reference to, for example, a conductive plug includes aspects having two or more such plug, unless the context clearly indicates otherwise. Further, spatially relative terms, such as "beneath," "below," "lower," "above," "upper" and the like, may be used herein for ease of description to describe one element or feature's relationship to another element(s) or feature(s) as illustrated in the figures.

FIG. 1 is a flow chart of a method 10 for manufacturing a semiconductor structure in accordance with some exemplary embodiments of the instant disclosure. The method 10 begins with operation 11 in which a target layer, a lower hard mask layer, a middle hard mask layer, and an upper hard mask layer are formed in sequence on a substrate. The method continues with operation 12 in which a first mask layer is formed on the upper hard mask layer, and the first mask layer has a plurality of openings exposing a portion of the upper hard mask layer. The method continues with operation 13 in which the exposed portion of the upper hard mask layer is etched to form a first patterned upper hard mask layer including at least one recess and at least one remained portion under the recess, and the remained portion remains a thickness that is less than a depth of the recess. The method continues with operation 14 in which a patterned organic layer is formed on the recess of the first patterned upper hard mask layer. The method continues with operation 15 in which the first patterned upper hard mask layer is etched to form a second patterned upper hard mask layer having a plurality of apertures exposing a portion of the middle hard mask layer. The method continues with operation 16 in which the middle hard mask layer, the lower hard mask layer, and the target layer are etched by using the second patterned upper hard mask layer as a mask to form a patterned target layer. The discussion that follows illustrates embodiments of semiconductor structure that can be manufactured according to the method 10 of FIG. 1. While method 10 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 2A through FIG. 6 are cross-sectional views illustrating various intermediary stages in manufacturing of a semiconductor structure in accordance with various embodiments.

Figure 2A:
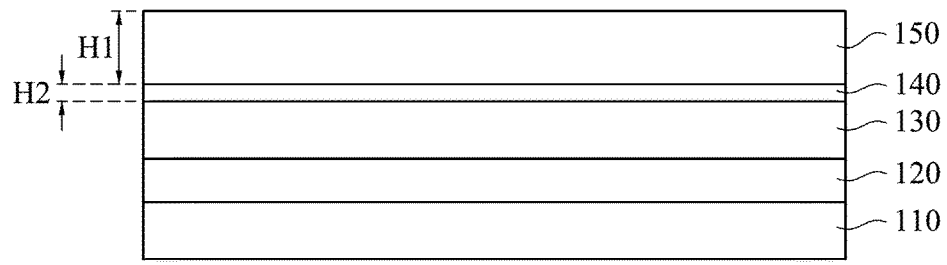
FIGS. 2A through 6 are cross-sectional views of various intermediary stages in the manufacturing of semiconductor structure in accordance with some embodiments of the instant disclosure.

Reference is made to FIG. 2A. A target layer 120, a lower hard mask layer 130, a middle hard mask layer 140, and an upper hard mask layer 150 are formed in sequence on a substrate 110 (operation 11 of FIG. 1). The target layer 120, the lower hard mask layer 130, the middle hard mask layer 140, and the upper hard mask layer 150 may be formed by any suitable deposition method, such as, plasma-enhanced atomic layer deposition (PEALD), chemical vapor deposition (CVD), plasma-enhanced chemical vapor deposition (PECVD), physical vapor deposition (PVD), and the like. In some embodiments, the upper hard mask layer 150 may have a thickness H1, and the middle hard mask layer 140 may have a thickness H2. In some embodiments, the thickness H1 is greater than the thickness H2. In some embodiments, the upper hard mask layer 150 and the middle hard mask layer 140 may be made of different materials, that is, the upper hard mask layer 150 may have an etch selectivity different from the middle hard mask layer 140. In some embodiments, the upper hard mask layer 150 is made of inorganic material. In some embodiments, the upper hard mask layer 150 and the middle hard mask layer 140 may include silicon oxide, silicon nitride (SiN), silicon oxynitride (SiON), silicon carbide, or the like. For example, the upper hard mask layer 150 may be made of oxide-rich silicon oxide, and the middle hard mask layer 140 may be made of silicon-rich silicon nitride (SiN). Further, the middle hard mask layer 140 and the lower hard mask layer 130 may also include different materials, and the middle hard mask layer 140 may also have an etch selectivity different from the lower hard mask layer 130. In some embodiments, the lower hard mask layer 130 may include amorphous carbon, or polysilicon oxide.

In some embodiments, the target layer 120 may include tetraethoxysilane (TEOS), spin-on-glass (SOG), SiON, a composite of low temperature oxide (LTO) and Si-contained BARC, or the like. In some embodiments, the target layer 120 may be a semiconductor substrate 110, such as a bulk semiconductor, a semiconductor-on-insulator (SOI) substrate 110, or the like, which may be doped (e.g., with a p-type or an n-type dopant) or undoped. In other embodiments, the target layer 120 may include silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 2B:
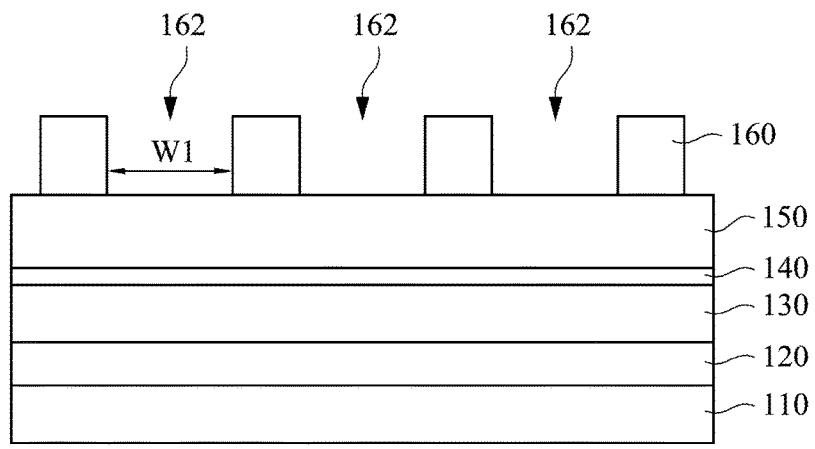

Reference is made to FIG. 2B. A first mask layer 160 is formed on the upper hard mask layer 150, and the first mask layer 160 has a plurality of openings 162 exposing a portion of the upper hard mask layer 150 (operation 12 of FIG. 1). Formation of the first mask layer 160 may include, for example, spin-on coating a photoresist material on the upper hard mask layer 150. Subsequently, the photoresist material is patterned to form the first mask layer 160 by photolithographic process. As shown in FIG. 2B the first mask layer 160 has a plurality of openings 162 exposing a portion of the upper hard mask layer 150. In some embodiments, each of the plurality of openings 162 has a width W1. In some embodiments, the first mask layer 160 may include a variety of patterns, for example, a stripe pattern, an island pattern, or an array of pillars. In some embodiments, the first mask layer 160 may have a plurality of stripe structures that are adjacent to each other.

Figure 2C:
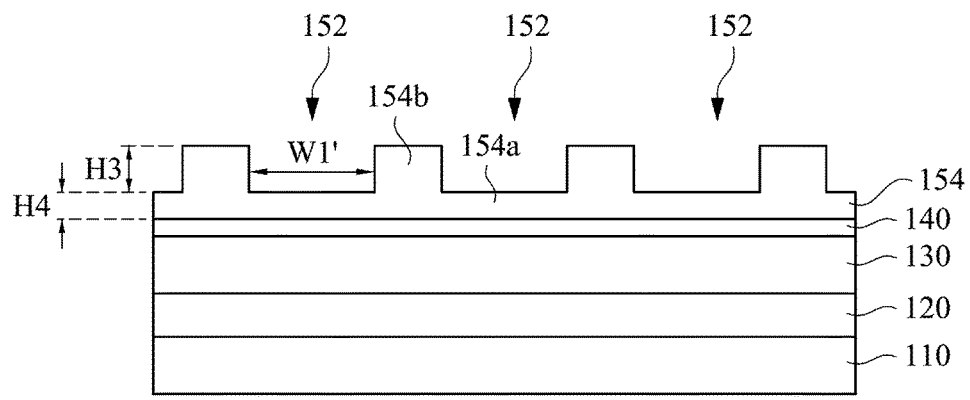

Reference is made to FIG. 2C. The exposed portion of the upper hard mask layer 150 is etched to form a first patterned upper hard mask layer 154 including at least one recess 152, at least one remained portion 154a under the recess 152, and the remained portion 154a remains a thickness H4 that is less than a depth H3 of the recess 152 (operation 13 of FIG. 1). In some embodiments, the depth H3 of the recess 152 is 120%-500% of the thickness H4 of the remained portion 154a, such as 150%, 180%, 200%, 220%, 250%, 280%, 300%, 350%, 400%, 450%, and 480%. The first patterned upper hard mask layer 154 is formed by performing an etching process, which may include etching the upper hard mask layer 150 by using the first mask layer 160 as an etch barrier. More specifically, the portion of the upper hard mask layer 150 which is exposed by the plurality of openings 162 shown in FIG. 2B is etched but not etched through to form the first patterned upper hard mask layer 154. In some embodiments, the etching process may include any suitable wet etching process or dry etching process such as a reactive ion etching (RIE) process. As shown in FIG. 2C, the first patterned upper hard mask layer 154 has one or more recesses 152, one or more remained portions 154a under the recesses 152, and one or more highland portions 154b. Two adjacent highland portions 154b are separated by a corresponding one of the recesses 152. The recess 152 has a depth H3, and the remained portion 154a of the first patterned upper hard mask layer 154 has a thickness H4. The depth H3 may also be the thickness of the highland portion 154b measured from an upper surface of the remained portion 154a. The thickness H4 is less than the depth H3, which means in the operation 13, an etching depth of the upper hard mask layer 150 is greater than the remained thickness of the first patterned upper hard mask layer 154. The openings 162 (shown in FIG. 2B) overlap the recess 152 (shown in FIG. 2C) in a direction perpendicular to a principle surface of the middle hard mask layer 140. In some embodiments, each recess 152 has a width W1' which is substantially equal to the width W1 of the openings 162. In some embodiments, the first patterned upper hard mask layer 154 may have a variety of patterns, for example, a stripe pattern, an island pattern, or an array of pillars. In some embodiments, the highland portion 154b of the first patterned upper hard mask layer 154 has a plurality of first stripe structures that is adjacent to each other.

Figure 3A:
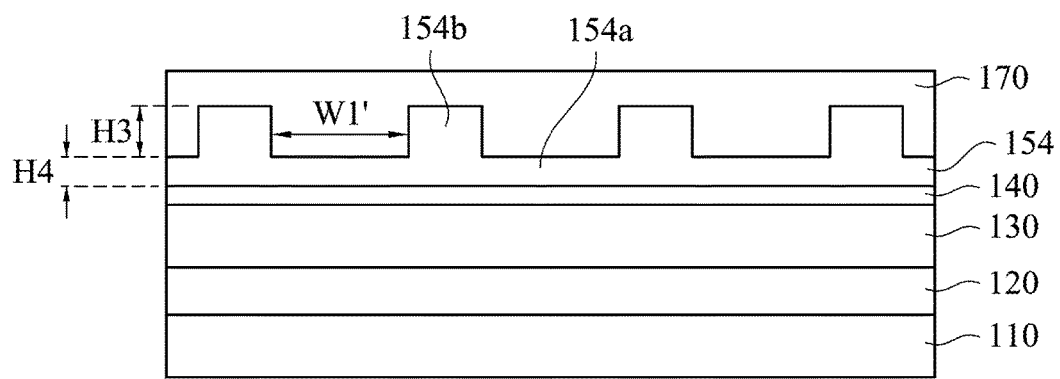
Figure 3B:
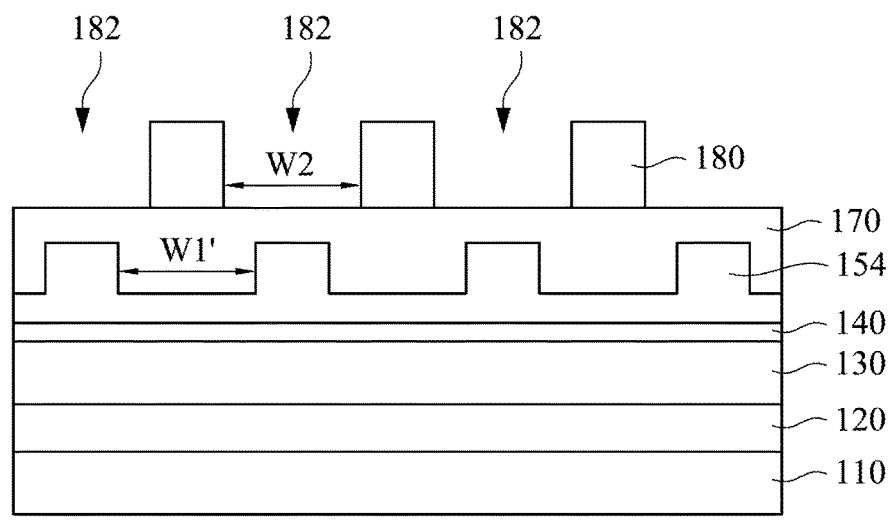
Figure 3C:
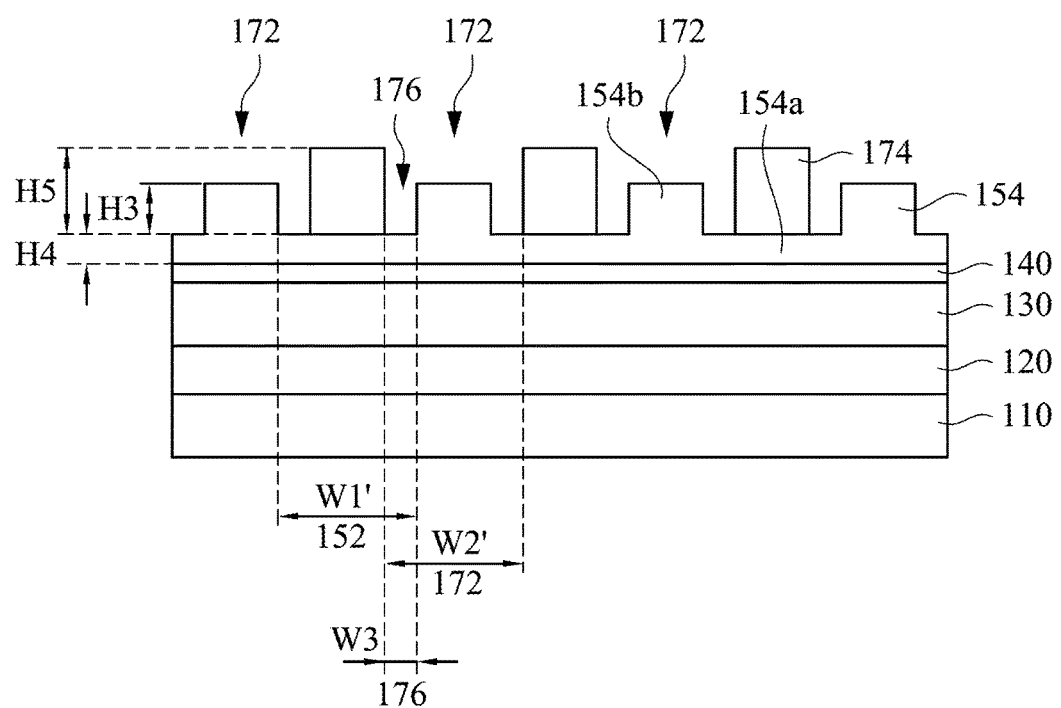

Reference is made to FIGS. 3A to 3C. A patterned organic layer 174 (shown in FIG. 3C) is formed on the recess 152 of the first patterned upper hard mask layer 154 (operation 14 of FIG. 1). Referring now to FIG. 3A, an organic layer 170 is formed over the substrate 110 and covers the first patterned upper hard mask layer 154. The organic layer 170 may be formed by suitable coating methods such as spin-on coating, die coating, and the like, or other deposition processes such as chemical vapor deposition (CVD), plasma-enhanced chemical vapor deposition (PECVD) and the like. The organic layer 170 fill the recess 152 of the first patterned upper hard mask layer 154 and has a thickness greater than the height of the highland portion 154b of the first patterned upper hard mask layer 154 so that the organic layer 170 has a planar upper surface over the substrate 110. In some embodiments, the organic layer 170 may include any suitable organic materials such as resist underlayer polymer. In some embodiments, a bottom anti-reflective coating (BARC) may further be formed on the organic layer 170.

Referring now to FIG. 3B, a second mask layer 180 is formed on the organic layer 170. Formation of the second mask layer 180 may be the same or similar to that of the formation of the first mask layer 160, which may include, for example, spin-on coating a photoresist material on the upper surface of the organic layer 170. Subsequently, a photolithographic process is performed to pattern the photoresist material and to form the second mask layer 180. As shown in FIG. 3B, the second mask layer 180 has a plurality of openings 182 exposing a portion of the organic layer 170. The second mask layer 180 is not overlapped with the highland portion 154b of the first patterned upper hard mask layer 154 in the direction perpendicular to the planar upper surface of the organic layer 170. More specifically, the second mask layer 180 is formed directly over the remained portion 154a of the first patterned upper hard mask layer 154. In some embodiments, each of the plurality of openings 182 has a width W2. In some embodiments, the width W2 may be greater than the width W1 and W1'. In yet some embodiments, the width W2 may be smaller than the width W1 and W1'. In some embodiments, the width W2 may be substantially equal to the width W1 and W1'. In some embodiments, the second mask layer 180 may include a variety of patterns, for example, a stripe pattern, an island pattern, or an array of pillars. In some embodiments, the second mask layer 180 may have a plurality of stripe structures that are adjacent to each other.

Referring now to FIG. 3C, a portion of the organic layer 170 is removed to form the patterned organic layer 174 positioned in the recess 152 (indicated in FIG. 2C), which means the patterned organic layer 174 is formed on the remained portion 154a of the first patterned upper hard mask layer 154. For example, the patterned organic layer 174 may be formed by performing an etching process, which includes etching a portion of the organic layer 170 exposed by the openings 182 by using the second mask layer 180 as a etch barrier. The etching process may stop while the remained portion 154a and the highland portion 154b of the first patterned upper hard mask layer 154 is exposed. As shown in FIG. 3C, the patterned organic layer 174 has a plurality of gaps 172 exposing the remained portion 154a and the highland portion 154b of the first patterned upper hard mask layer 154. A plurality of trenches 176 are formed between the highland portions 154b of the first patterned upper hard mask layer 154 and the patterned organic layer 174. In some embodiments, the patterned organic layer 174 and the highland portion 154b of the first patterned upper hard mask layer 154 are misaligned and separated by the trenches 176. In some embodiments, each of the plurality of gaps 172 has a width W2', which is substantially equal to the width W2 of the openings 182. In some embodiments, each of the plurality of trenches 176 has a width W3. In some embodiments, the width W3 is smaller than the width W1, W1', W2, and W2'. In some embodiments, the patterned organic layer 174 may have a variety of patterns, for example, a stripe pattern, an island pattern, or an array of pillars. In some embodiments, the patterned organic layer 174 may have a plurality of second stripe structures. In some embodiments, the plurality of second stripe structures of the patterned organic layer 174 are parallel with the plurality of first stripe structures of the highland portion 154b of the first patterned upper hard mask layer 154. In some embodiments, each of the second stripe structures is disposed between adjacent ones of the first stripe structures. In some embodiments, the patterned organic layer 174 has a thickness H5. In some embodiments, the thickness H5 may be greater than or equal to the thickness H3 of the highland portion 154b of the first patterned upper hard mask layer 154. In some embodiments, the thickness H5 of the patterned organic layer 174 is 100%-300% of the thickness H3 of the highland portion 154b of the first patterned upper hard mask layer 154, such as 120%, 150%, 200%, and 250%.

Figure 4:
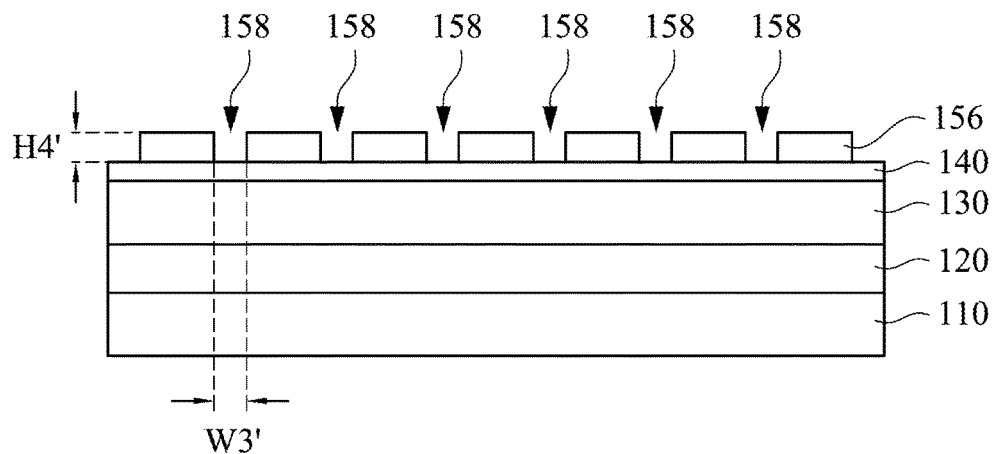

Reference is made to FIG. 4. The first patterned upper hard mask layer 154 is etched to form a second patterned upper hard mask layer 156 having a plurality of apertures 158 exposing a portion of the middle hard mask layer 140 (operation 15 of FIG. 1). The second patterned upper hard mask layer 156 is formed by performing an etching process. In some embodiments, the etching process may include a dry etching process such as a reactive ion etching (RIE) process. More specifically, the etching process includes etching the remained portion 154a of the first patterned upper hard mask layer 154 which is exposed by the trenches 176 until the middle hard mask layer 140 is exposed. As shown in FIG. 4 and FIG. 3C, the second patterned upper hard mask layer 156 has a plurality of apertures 158 exposing a portion of the middle hard mask layer 140. The apertures 158 are aligned with the trenches 176. In some embodiments, each of the apertures 158 has a width W3', which is substantially equal to or less than the width W3 of the trenches 176. The width W3' may also be smaller than the width W1, W1', W2, and W2'. In some embodiments, the second patterned upper hard mask layer 156 has a thickness H4'. In some embodiments, the thickness H4' may be substantially equal to the thickness H4 of the remained portion 154a of the first patterned upper hard mask layer 154 shown in FIG. 3C. In some embodiments, the second patterned upper hard mask layer 156 may include a variety of patterns, for example, a stripe pattern, an island pattern, or an array of pillars. In some embodiments, the second patterned upper hard mask layer 156 has a contour (in a plan view) that is the same as or similar to the collection of the pattern of highland portion 154b of the first patterned upper hard mask layer 154 and the pattern of the patterned organic layer 174.

Figure 5:
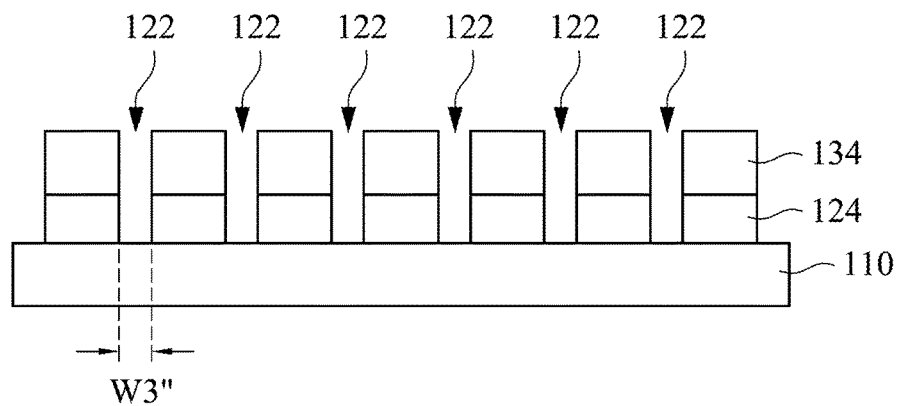
Figure 6:
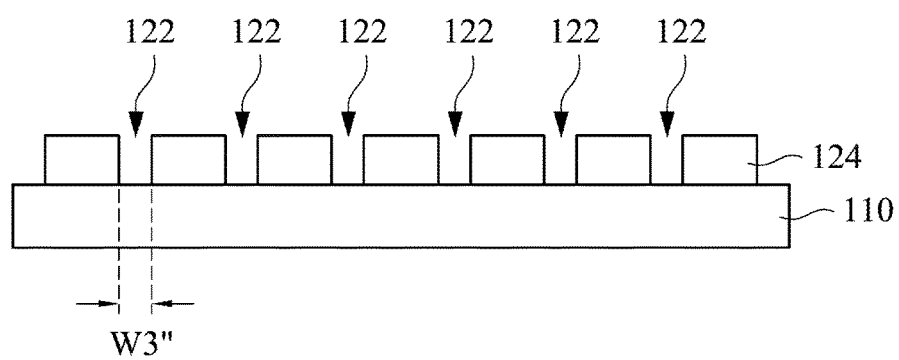

Reference is made to FIGS. 5 and 6. The middle hard mask layer 140, the lower hard mask layer 130, and the target layer 120 are etched to form a patterned target layer 124 by using the second patterned upper hard mask layer 156 as a mask (operation 15 of FIG. 1). The patterned target layer 124 is formed by performing a dry etching process such as a reactive ion etching (RIE) process. More specifically, the etching process may include using the second patterned upper hard mask layer 156 as an etch barrier, and etching through the middle hard mask layer 140, the lower hard mask layer 130, and the target layer 120 which underlies the apertures 158. As shown in FIG. 5, the etching process may stop while the substrate 110 is exposed, and a patterned lower hard mask layer 134 and the patterned target layer 124 are formed. Subsequently, as shown in FIG. 6 the patterned lower hard mask layer 134 over the patterned target layer 124 is removed, and the patterned target layer 124 has a plurality of holes 122 exposing the substrate 110. The holes 122 are aligned with the apertures 158, and the patterned target layer 124 is aligned with the second patterned upper hard mask layer 156. In some embodiments, each of the holes 122 has a width W3", which is substantially equal to the width W3 of the trenches 176 and the width W3' of the apertures 158, so that the width W3" may also be smaller than the width W1, W1', W2, and W2'. In some embodiments, the patterned target layer 124 may include a variety of patterns, for example, a stripe pattern, an island pattern, or an array of pillars. In some embodiments, the patterned target layer 124 has a contour (in a plan view) that is the same as or similar to the pattern of the second patterned upper hard mask layer 156.

The method for manufacturing a semiconductor structure disclosed herein is a novel method. The embodiments of the present disclosure have advantages over conventional methods, and the advantages are summarized below. The method of the present disclosure prevents the damage of the patterned layer during the pattern transferring processes, reduces the pitch of patterns, and improves etching uniformity of the patterns. The patterned target layer formed by the method of the present disclosure has a relatively smaller critical dimension and obtains uniform patterns.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a semiconductor structure, comprising:
    forming a target layer, a lower hard mask layer, a middle hard mask layer, and an upper hard mask layer in sequence on a substrate;
    forming a first mask layer on the upper hard mask layer, wherein the first mask layer has a plurality of openings exposing a portion of the upper hard mask layer;
    etching the exposed portion of the upper hard mask layer to form a first patterned upper hard mask layer comprising at least one recess, at least one remained portion under the recess, and at least one highland portion adjacent to the recess, wherein the remained portion remains a thickness that is less than a depth of the recess;
    forming a patterned organic layer on the recess of the first patterned upper hard mask layer, wherein the patterned organic layer and the highland portion of the first patterned upper hard mask layer are misaligned;
    etching the first patterned upper hard mask layer to form a second patterned upper hard mask layer having a plurality of apertures exposing a portion of the middle hard mask layer; and
    etching the middle hard mask layer, the lower hard mask layer, and the target layer by using the second patterned upper hard mask layer as a mask to form a patterned target layer.

2. The method of claim 1, wherein the first patterned upper hard mask layer has a plurality of first stripe structures, the patterned organic layer has a plurality of second stripe structures, the first stripe structures are parallel with the second stripe structures, and each of the second stripe structures is disposed between the first stripe structures.

3. The method of claim 1, wherein the upper hard mask layer has a thickness that is greater than a thickness of the middle hard mask layer.

4. The method of claim 1, wherein the upper hard mask layer and the middle hard mask layer are made of different material.

5. The method of claim 4, wherein the upper hard mask layer comprises silicon oxide, silicon nitride, silicon oxynitride or silicon carbide.

6. The method of claim 4, wherein the middle hard mask layer comprises silicon oxide, silicon nitride, silicon oxynitride or silicon carbide.

7. The method of claim 1, wherein the middle hard mask layer and the lower hard mask layer are made of different material.

8. The method of claim 7, wherein the lower hard mask layer comprises amorphous carbon, or polysilicon oxide.

9. The method of claim 1, wherein etching the exposed portion of the upper hard mask layer comprises using an anisotropic etching process.

10. The method of claim 1, wherein etching the first patterned upper hard mask layer comprises using an anisotropic etching process.

11. The method of claim 1, wherein etching the middle hard mask layer, the lower hard mask layer, and the target layer are performed by anisotropic etching process.

12. The method of claim 1, wherein forming the patterned organic layer on the recess of the first patterned upper hard mask layer is further comprising:
   forming an organic layer covering the first patterned upper hard mask layer;
   forming a second mask layer on the organic layer; and
   etching the organic layer to form the patterned organic layer.

13. The method of claim 1, wherein the patterned organic layer has a plurality of gaps exposing a top surface of the first patterned upper hard mask layer.

14. The method of claim 1, wherein the patterned organic layer has a thickness that is greater than a thickness of the first patterned upper hard mask layer.

* * * * *